(12) United States Patent
Hao et al.

(10) Patent No.: US 9,817,290 B2
(45) Date of Patent: Nov. 14, 2017

(54) TFT SUBSTRATE AND DISPLAY DEVICE

(71) Applicants: Shenzhen China Star Optoelectronics Technology Co., Ltd., Shenzhen, Guangdong (CN); Wuhan China Star Optoelectronics Technology Co., Ltd., Wuhan, Hubei (CN)

(72) Inventors: Sikun Hao, Guangdong (CN); Qipei Zhang, Guangdong (CN)

(73) Assignees: Shenzhen China Star Optoelectronics Technology Co., Ltd, Shenzhen, Guangdong (CN); Wuhan China Star Optoelectronics Technology Co., Ltd, Wuhan, Hubei (CN)

( * ) Notice: Subject to any disclaimer, the term of this patent is extended or adjusted under 35 U.S.C. 154(b) by 19 days.

(21) Appl. No.: 14/767,647

(22) PCT Filed: Jul. 10, 2015

(86) PCT No.: PCT/CN2015/083743
§ 371 (c)(1),
(2) Date: Aug. 13, 2015

(87) PCT Pub. No.: WO2016/206136
PCT Pub. Date: Dec. 29, 2016

(65) Prior Publication Data
US 2017/0010510 A1    Jan. 12, 2017

(30) Foreign Application Priority Data

Jun. 26, 2015 (CN) .................... 2015 1 03632489

(51) Int. Cl.
*H01L 23/28* (2006.01)
*G02F 1/1362* (2006.01)
*H01L 27/12* (2006.01)

(52) U.S. Cl.
CPC ...... *G02F 1/136286* (2013.01); *H01L 27/124* (2013.01); *H01L 27/1222* (2013.01)

(58) Field of Classification Search
CPC ........... G02F 1/136286; H01L 27/1222; H01L 27/124
(Continued)

(56) References Cited

U.S. PATENT DOCUMENTS

2007/0008266 A1* 1/2007 Kobashi ............... G09G 3/3677
                                                                345/90
2011/0018790 A1    1/2011 Lee et al.
(Continued)

FOREIGN PATENT DOCUMENTS

CN       101093843 A    12/2007
CN       102566168 A     7/2012
(Continued)

*Primary Examiner* — Caleb Henry
(74) *Attorney, Agent, or Firm* — Andrew C. Cheng

(57) ABSTRACT

The present invention discloses a TFT substrate and a display device. The TFT substrate comprises a scan line, a data line and a common electrode covering the scan line and the data line, wherein the data line and the scan line are disposed in a stagger, in order to divide the crosswise formed region into a plurality of pixel units; the common electrode comprises a plurality of common electrode units and a plurality of bridging portions overlapping with the scan lines and the data lines, wherein the common electrode unit and the pixel unit are correspondingly disposed, each bridging portion is connected with at least two adjacent common electrodes in order to make all of the common electrodes be electrically connected. Through the above ways, the present invention can reduce the RC constant and power consumption, thereby improving the product quality.

11 Claims, 5 Drawing Sheets

(58) Field of Classification Search
USPC .......................................................... 257/776
See application file for complete search history.

(56) References Cited

U.S. PATENT DOCUMENTS

| | | |
|---|---|---|
| 2011/0063565 A1 | 3/2011 | Yoon et al. |
| 2012/0050643 A1 | 3/2012 | Li et al. |
| 2013/0314389 A1* | 11/2013 | Wang ................. G09G 3/3648 345/211 |
| 2014/0054617 A1 | 2/2014 | Li et al. |
| 2014/0085582 A1* | 3/2014 | Chang ............... G02F 1/134309 349/138 |
| 2015/0194110 A1* | 7/2015 | Park .................... G09G 3/3614 345/213 |
| 2016/0004106 A1* | 1/2016 | Chiu ..................... G02F 1/1339 349/43 |
| 2016/0004107 A1* | 1/2016 | Chiu ................. G02F 1/133784 349/43 |
| 2016/0005347 A1* | 1/2016 | Chen ................ G02F 1/133707 345/88 |
| 2016/0080731 A1* | 3/2016 | Niu .................... H04N 13/0404 348/54 |
| 2016/0147119 A1* | 5/2016 | Chang ............... G02F 1/134309 349/33 |
| 2016/0334682 A1 | 11/2016 | Zhang et al. |

FOREIGN PATENT DOCUMENTS

| | | |
|---|---|---|
| CN | 103824865 A | 5/2014 |
| KR | 20080040373 A | 5/2008 |

\* cited by examiner

TFT SUBSTRATE AND DISPLAY DEVICE

BACKGROUND OF THE INVENTION

1. Field of the Invention

The present invention relates to a display technical field; and in particular to one kind of TFT substrate and display device.

2. The Related Arts

Liquid crystal displays are currently the most widely used tablet displays, which have gradually become high-resolution color screen displays which are widely used by a variety of electronic devices such as mobile phones, personal digital assistants (PDAs), digital cameras, computer screen or notebook screen.

Low temperature poly-silicon (LTPS) thin film transistor liquid crystal display, the electron mobility of which can be higher than 200 $cm^2$/V-sec, can effectively reduce the area of the thin film transistor device, thereby improving the aperture ratio, and also can reducing the overall power consumption at the same time of enhancing the display brightness. Otherwise, the higher electron mobility can integrate part of driver circuit on a glass substrate, reducing the amount of driving IC, it can also significantly improve the reliability of the liquid crystal display panel, thereby significantly reducing the manufacturing cost of producing panels. Therefore, the LTPS technology has a wide range of applications (in particular to the small size products such as mobile phones) in the field of liquid crystal display.

In the display region of the LTPS array substrate, gate lines and data lines generally use good conductivity metal wires. However, the metal trace does not only have resistance, but also have overlapping region with other conductive layers, there is generally a insulating layer in the overlapping region between two conductors, thus existing the capacitance. For liquid crystal display screen, the large RC constant will result the pixels insufficient charging, the images difference, the pixel qualitative difference, it will also lead to increasing power consumption and poor partial heat dissipation of the display panel such issues.

SUMMARY OF THE INVENTION

The main technical issue to be solved by the present invention is to provide a TFT substrate and a display device, which can reduce RC constant and power consumption between the metals, thereby improve the product quality.

In order to solve the above technical issue, one technical solution adopted by the present invention is: to provide a TFT substrate, the TFT substrate comprises a plurality of mutually parallel scan lines, a plurality of mutually parallel data lines and a common electrode covering on the scan lines and data lines, wherein: the multiple data lines and the multiple scan lines are disposed in a stagger, in order to divide the crosswise formed region into a plurality of pixel units; the common electrode comprises a plurality of common electrode units and a plurality of bridging portions overlapping with the scan lines and the data lines, wherein the common electrode unit and the pixel unit are correspondingly disposed, each bridging portion is connected with at least two adjacent common electrodes in order to make all of the common electrodes be electrically connected; wherein the bridging portion is directly obtained from the etching process of the common electrode, or the bridging portion is a conductive film that is plated on the formed multiple common electrode units.

Wherein each bridging portion is connected with two adjacent common electrodes arranged along with the first direction or is connected with two adjacent common electrodes arranged along with the second direction which is perpendicular to the first direction.

In order to solve the above technical issue, another technical solution adopted by the present invention is: to provide a TFT substrate, the TFT substrate comprises a plurality of mutually parallel scan lines, a plurality of mutually parallel data lines and a common electrode covering on the scan lines and data lines, wherein: the multiple data lines and the multiple scan lines are disposed in a stagger, in order to divide the crosswise formed region into a plurality of pixel units; the common electrode comprises a plurality of common electrode units and a plurality of bridging portions overlapping with the scan lines and the data lines, wherein the common electrode unit and the pixel unit are correspondingly disposed, each bridging portion is connected with at least two adjacent common electrodes in order to make all of the common electrodes be electrically connected.

Wherein each bridging portion is connected with four adjacently disposed common electrodes.

Wherein each bridging portion is connected with two adjacent common electrodes arranged along with the first direction or is connected with two adjacent common electrodes arranged along with the second direction which is perpendicular to the first direction.

Wherein each common electrode unit is connected with all adjacent common electrode units which are arranged along with the first direction and the second direction which is perpendicular to the first direction through the bridging portion, in order to make all common electrode units establish a latticed connection.

Wherein each common electrode unit is connected with part of adjacent common electrode units which are arranged along with the first direction and the second direction through the bridging portion, in order to make all common electrode units establish a linear connection.

Wherein the bridging portion comprises a first bridging portion and a second bridging portion, in each two common electrode units arranged along with the first direction or the second direction, each two common electrode units which are corresponded at adjacent lines are individually connected through the first bridging portion, each two common electrode units which are on the same side are connected at intervals through the second bridging portion.

Wherein the bridging portion comprises a first bridging portion and a second bridging portion, between a line of each common electrode unit arranged along with the first direction or the second direction is connected through the first bridging portion, and the place on the edge of the line of common electrode unit is connected with the common electrode unit which is on the corresponded place at the adjacent line through the second bridging portion.

Wherein the bridging portion is directly obtained from the etching process of the common electrode.

Wherein the bridging portion is a conductive film that is plated on the formed multiple common electrode units.

In order to solve the above technical issue, the other technical solution adopted by the present invention is: to provide a display panel, the display panel comprises a TFT substrate, the TFT substrate comprises a plurality of mutually parallel scan lines, a plurality of mutually parallel data lines and a common electrode covering on the scan lines and data lines, wherein: the multiple data lines and the multiple scan lines are disposed in a stagger, in order to divide the crosswise formed region into a plurality of pixel units; the common electrode comprises a plurality of common electrode units and a plurality of bridging portions overlapping with the scan lines and the data lines, wherein the common electrode unit and the pixel unit are correspondingly disposed, each bridging portion is connected with at least two adjacent common electrodes in order to make all of the common electrodes be electrically connected.

Wherein each bridging portion is connected with four adjacently disposed common electrodes.

Wherein each bridging portion is connected with two adjacent common electrodes arranged along with the first direction or is connected with two adjacent common electrodes arranged along with the second direction which is perpendicular to the first direction.

Wherein each common electrode unit is connected with all adjacent common electrode units which are arranged along with the first direction and the second direction which is perpendicular to the first direction through the bridging portion, in order to make all common electrode units establish a latticed connection.

Wherein each common electrode unit is connected with part of adjacent common electrode units which are arranged along with the first direction and the second direction through the bridging portion, in order to make all common electrode units establish a linear connection.

Wherein the bridging portion comprises a first bridging portion and a second bridging portion, in each two common electrode units arranged along with the first direction or the second direction, each two common electrode units which are corresponded at adjacent lines are individually connected through the first bridging portion, each two common electrode units which are on the same side are connected at intervals through the second bridging portion.

Wherein the bridging portion comprises a first bridging portion and a second bridging portion, between a line of each common electrode unit arranged along with the first direction or the second direction is connected through the first bridging portion, and the place on the edge of the line of common electrode unit is connected with the common electrode unit which is on the corresponded place at the adjacent line through the second bridging portion.

Wherein the bridging portion is directly obtained from the etching process of the common electrode.

Wherein the bridging portion is a conductive film that is plated on the formed multiple common electrode units.

The benefit of the present invention is: to distinguish to the situation of the prior art, the TFT substrate comprises a plurality of mutually parallel scan lines, a plurality of mutually parallel data lines and a common electrode covering on the scan lines and data lines, wherein: the multiple data lines and the multiple scan lines are disposed in a stagger, in order to divide the crosswise formed region into a plurality of pixel units; the common electrode comprises a plurality of common electrode units and a plurality of bridging portions overlapping with the scan lines and the data lines, wherein the common electrode unit and the pixel unit are correspondingly disposed, each bridging portion is connected with at least two adjacent common electrodes in order to make all of the common electrodes be electrically connected. Therefore, the common electrode in the present invention provides a bridging portion on the place where is corresponded to the scan lines and data lines, reducing the common electrode overlapped by the scan line and the data line, also reducing the capacitances between the scan line and common electrode as well as the data line and common electrode, it can decrease the RC constant and power consumption, thereby improving the product quality.

DETAILED DESCRIPTION OF THE PREFERRED EMBODIMENTS

Figure 1:
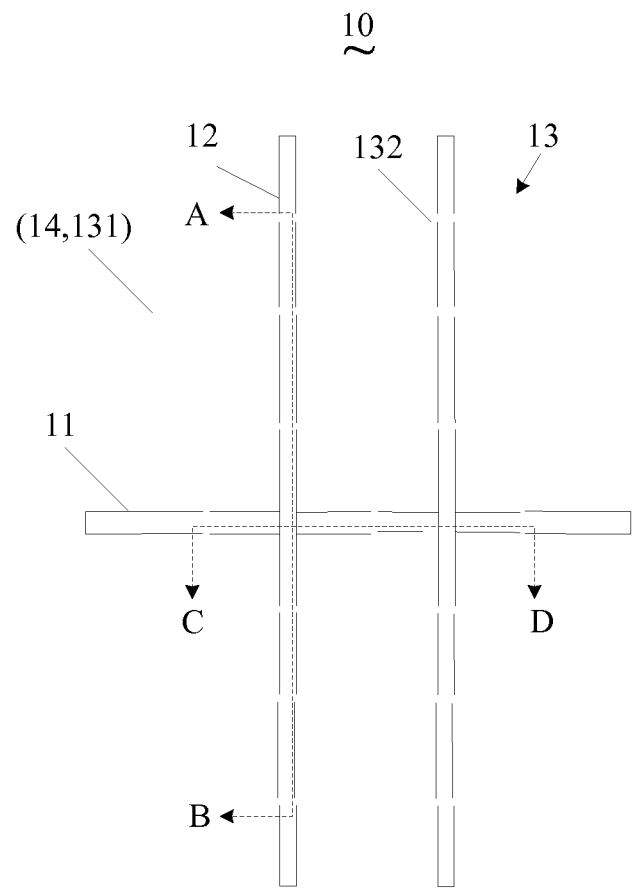
FIG. 1 is a structure diagram of a TFT substrate provided by the embodiment of the present invention.
Figure 2:
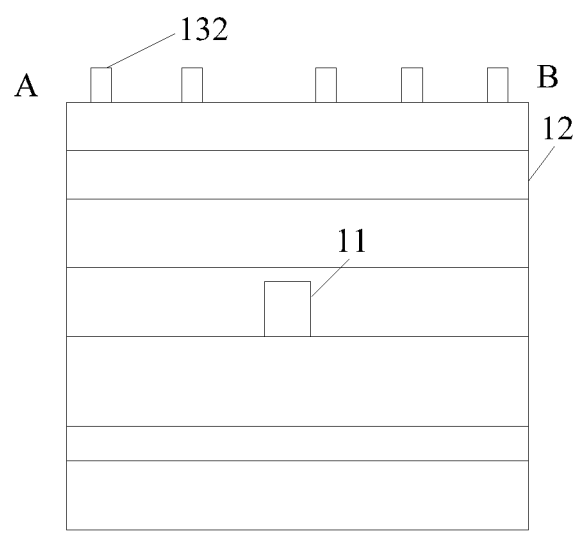
FIG. 2 is a sectional view of the TFT substrate along the dotted line AB as shown in FIG. 1.
Figure 3:
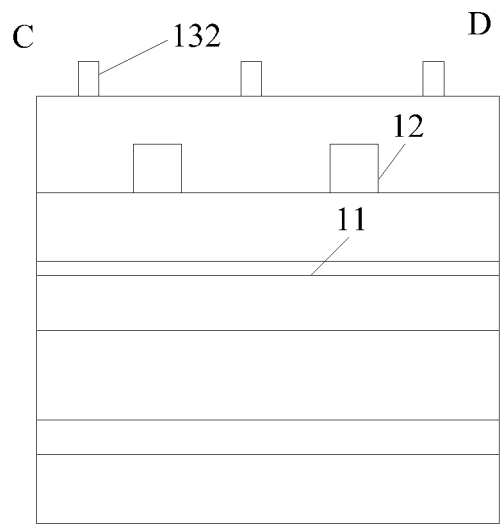
FIG. 3 is a sectional view of the TFT substrate along the dotted line CD as shown in FIG. 1.

Refer to FIG. 1 to FIG. 3, FIG. 1 is a structure diagram of a TFT substrate provided by the embodiment of the present invention. FIG. 2 is a sectional view of the TFT substrate along the dotted line AB as shown in FIG. 1, FIG. 3 is a sectional view of the TFT substrate along the dotted line CD as shown in FIG. 1. The thin film transistor, TFT, substrate 10 comprises a plurality of mutually parallel scan lines 11, a plurality of mutually parallel data lines 12 and a common electrode 13 covering on the scan lines 11 and data lines 12. FIG. 1 shows only a scanning line 11 and the two data lines 12, it should be understood that FIG. 1 is just a partial structure of the TFT substrate 10, which can not limit the specific number of the data lines 12 and the scan lines 11 of the embodiment of the present invention.

Wherein the multiple data lines 12 and the multiple scan lines 11 are disposed in a stagger, in order to divide the crosswise formed region into a plurality of pixel units 14. Wherein the extending direction of the data line 12 is defined as a first direction, the extending direction of the scan line 11 is defined as a second direction. Or define the extending direction of the scan line 11 as a first direction, define the extending direction of the data line 12 as a second direction.

The common electrode 13 comprises a plurality of common electrode units 131 and a plurality of bridging portions 132 overlapping with the scan lines 11 and the data lines 12, wherein the bridging portion 132 overlapped with the scan line 11, the width of the extending direction of the bridging portion 132 along the scan line 11 is less than the length of the extending direction of the common electrode unit 131 along the scan line 11. Similarly, the bridging portion 131 overlapped with the data line 12, the width of the extending direction of the bridging portion 132 along the data line 12 is less than the length of the extending direction of the common electrode unit 131 along the data line 12. The common electrode unit 131 and the pixel unit 141 are correspondingly disposed, each bridging portion 132 is connected with at least two adjacent common electrodes 131 in order to make all of the common electrodes be electrically connected. Therefore, there is only the bridging portion 132 in the place that the common electrode 13 is corresponded to the scan line 11 and the data line 12. Thus the overlapping area of common electrode 13 and the scan line 11 as well as the common electrode 13 and the data line 12 can be reduced, thereby reducing the capacitance between the common electrode 13 and the scan line 11 as well as the common electrode 13 and the data line 12, thus reducing the RC constant and power consumption, improving the product quality.

The connection method of the bridging portion of the present embodiment comprises the followings:

Method 1: each bridging portion 132 is connected with two adjacent common electrodes 131 arranged along with the first direction or is connected with two adjacent common electrodes 131 arranged along with the second direction which is perpendicular to the first direction. In the first method, it also comprises the following situations:

Situation 1: refer to FIG. 1 to FIG. 3, each common electrode unit 131 is connected with all adjacent common electrode units 131 which are arranged along with the first direction and the second direction which is perpendicular to the first direction through the bridging portion 132, in order to make all common electrode units 131 establish a latticed connection. To set the first direction to be the extending direction of the data line 12 and the second direction to be the extending direction of the scan line 11. In the present embodiment, the common electrode unit 131 arranged along with the first direction, two adjacent common electrode units 131 are connected with each other through a bridging portion 132 overlapped with the scan line 11, the common electrode 131 arranged along with the second direction, two adjacent common electrode units 131 are connected with each other through three bridging portions 132 overlapped with the data line 12. Therefore, the overlapped area of the common electrodes 13 corresponded by the data line 12 and the scan line 11. Take the display device of which the ppi (Pixels Per Inch) is 446 for example, the size is 19*57 um. The width range of the bridging portion 132 in the present invention is between 1 um to 10 um, it is preferably 3 um. Respecting to the common electrode overall covering the data line 12 and the scan line 11 of the prior art, the capacitance generated between the common electrode as shown in FIG. 3 and data line 12 as well as scan line 11 is reduced to (3*4)/(19+57)=3/19 of the prior art, RC constant is also reduced to 3/19 of the prior art. Therefore, it can significantly reduce the RC delay of the circuit, increase the charging rate, improve the screen quality, and thereby raise the product quality.

Figure 4:
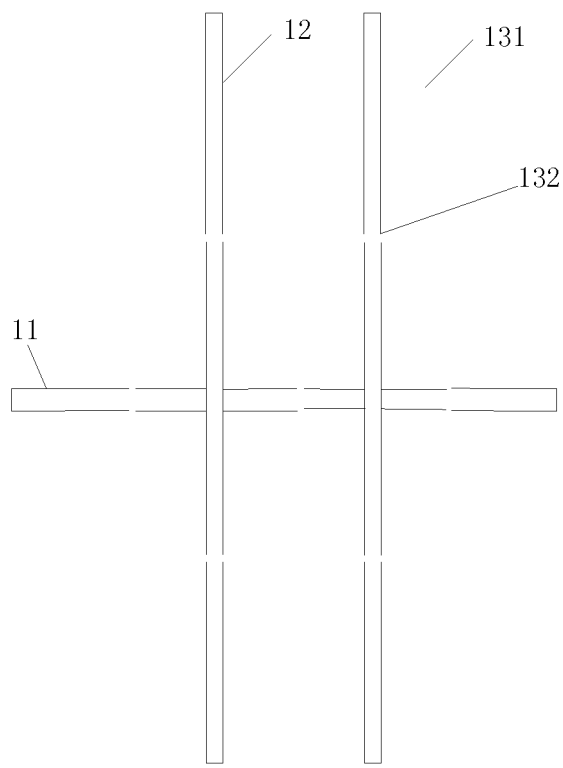
FIG. 4 is a schematic diagram of a connection method of a bridging portion.

It should be understood that the amount of the bridging portion 132 as shown in FIG. 3 could be changed under the first situation, but there is at least one bridging portion 132 between each two adjacent common electrode 131. When there is only one bridging portion 132 between each two adjacent common electrode 131, the structure is shown as FIG. 4. Similarly, take the display device of which the ppi (Pixels Per Inch) is 446 for example, the capacitance generated between the common electrode as shown on FIG. 4 and data line 12 as well as scan line 11 is reduced to (3*2)/(19+57)=3/38 of the prior art, RC constant is also reduced to 3/38 of the prior art. Therefore, the bridging portion 132 of FIG. 4 can more significantly reduce the RC delay of the circuit, increase the charging rate, improve the screen quality, and thereby raise the product quality.

Situation 2: each common electrode unit 131 is connected with part of adjacent common electrode units 131 which are arranged along with the first direction and the second direction through the bridging portion 132, in order to make all common electrode units establish a linear connection. For details, please refer to FIG. 5 and FIG. 6.

Figure 5:
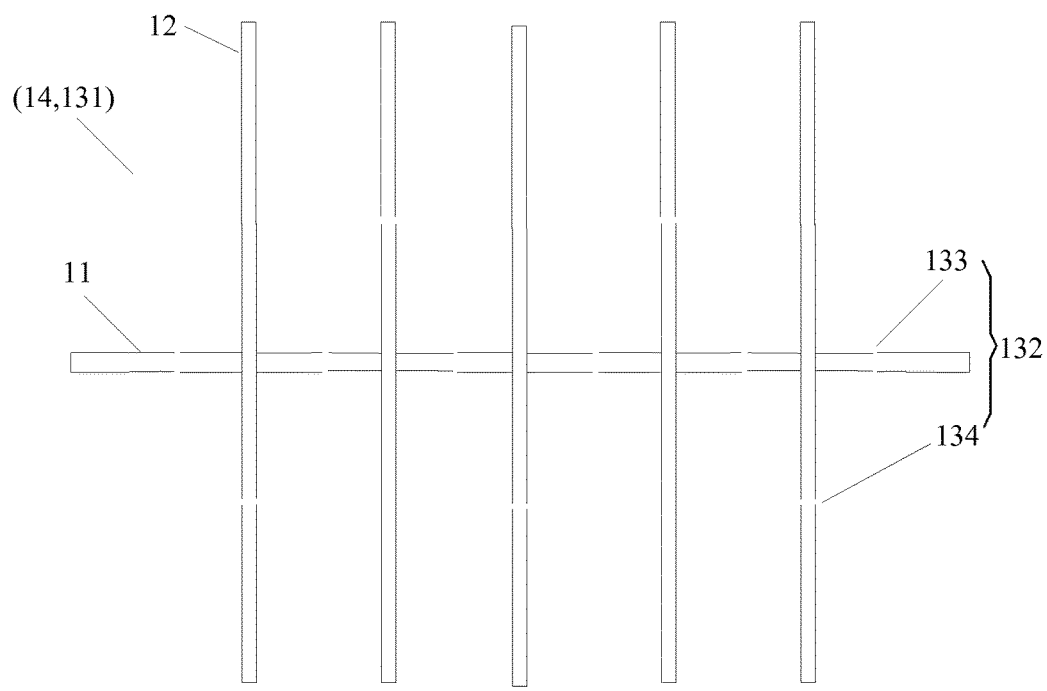
FIG. 5 is a schematic diagram of another connection method of a bridging portion.

Refer to FIG. 5, FIG. 5 shows two lines of the common electrode unit 131. In the present embodiment, the bridging portion 132 comprises a first bridging portion 133 and a second bridging portion 134, in each two common electrode units 131 arranged along with the first direction or the second direction, each two common electrode units 131 which are corresponded at adjacent lines are individually connected through the first bridging portion 133, each two common electrode units 131 which are on the same side are connected at intervals through the second bridging portion 132. As shown in FIG. 5, two common electrode units 131 corresponded and adjacent to each scan line 11 are connected with each other through the first bridging portion 133, the common electrode units 131 on the same line are connected with each other through the second bridging portion 134 on the interval data line 12. Between each two adjacent common electrode units 131 as shown in FIG. 5 is connected with each other through a bridging portion 132, in the other embodiment, the amount of the bridging portion 132 can also properly add, it is not limited.

Figure 6:
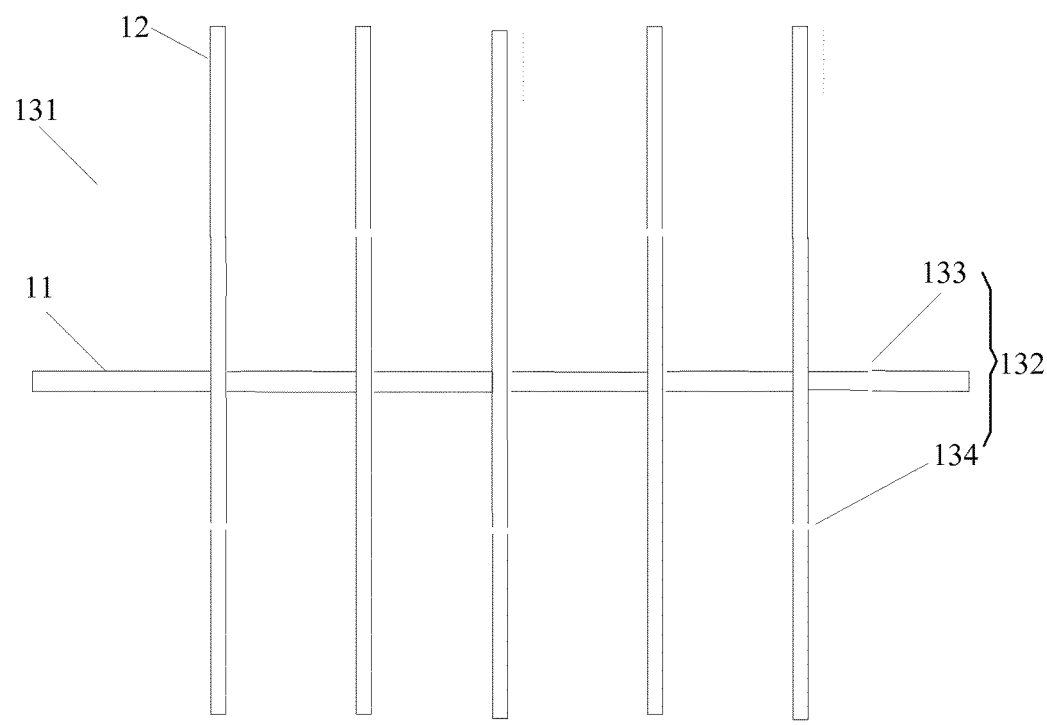
FIG. 6 is a schematic diagram of the other connection method of a bridging portion.
Figure 7:
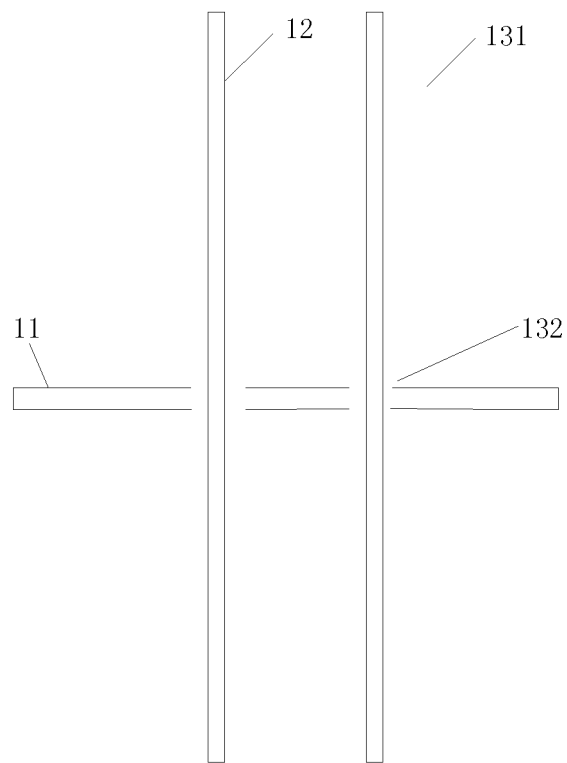
FIG. 7 is a schematic diagram of the other connection method of a bridging portion.

Refer to FIG. 6, which is the same as FIG. 5, it only shows two lines of common electrode units 131. The bridging portion 132 also comprises a first bridging portion 133 and a second bridging portion 134. Wherein between a line of each common electrode unit 131 arranged along with the first direction or the second direction is connected through the first bridging portion 133, and the place on the edge of the line of common electrode unit 131 is connected with the common electrode unit 131 which is on the corresponded place at the adjacent line through the second bridging portion 134.

FIG. 6 is that the common electrode units 131 on the edge of two lines are connected with each other through the second bridging portion 134. It should be understood that the common electrode units 131 corresponded to each other on the other place also can be connected with each other through the second bridging portion 134.

The above introduction is the situation of the bridging portion 132 connected with two adjacent common electrode units 131, in the present embodiment, the bridging portion 132 also can be connected with four adjacent common electrode units 131. Each bridging portion 132 is disposed on the intersecting place of the data line 12 and the scan line 11, in order to connect with the four adjacently disposed common electrode units 131.

It should be understood that the above introduction is partial connection method of the bridging portion 132, the connection method of the bridging portion 132 protected by the embodiment of the present invention can not be limited, all connection methods of the bridging portions 132 electrically connected with all the common electrode units 131 are protected by the embodiments of the present invention.

Wherein the bridging portion 132 of the present invention can be obtained through two technical ways: the first one is to be directly obtained from the etching process of the common electrode. Namely, the place of the common electrode 13 corresponded to the data line 12 and scan line 11 is wholly etched, and then plated an conductive film on the corresponding position. In the present embodiment, the conductivity of the conductive film is better than the conductivity of the common electrode material. Therefore, when the conductive film is used as bridging portion, the width of the bridging portion could be smaller.

The present embodiment provides a bridging portion 132 on the place of the common electrode 13 corresponded to the scan line 11 and the data line 12, electrically connecting the common electrode units 131 through the bridging portion 132, making the overlapped areas of the common electrode 13 and the scan line 11 as well as the common electrode 13 and the data line 12 decreased, thus reducing the capacitance between the common electrode 13 and scan line 11 as well as thee common electrode 13 and the data line 12, thereby lowering the RC constant and power consumption of the TFT panel, improving the screen quality.

Figure 8:
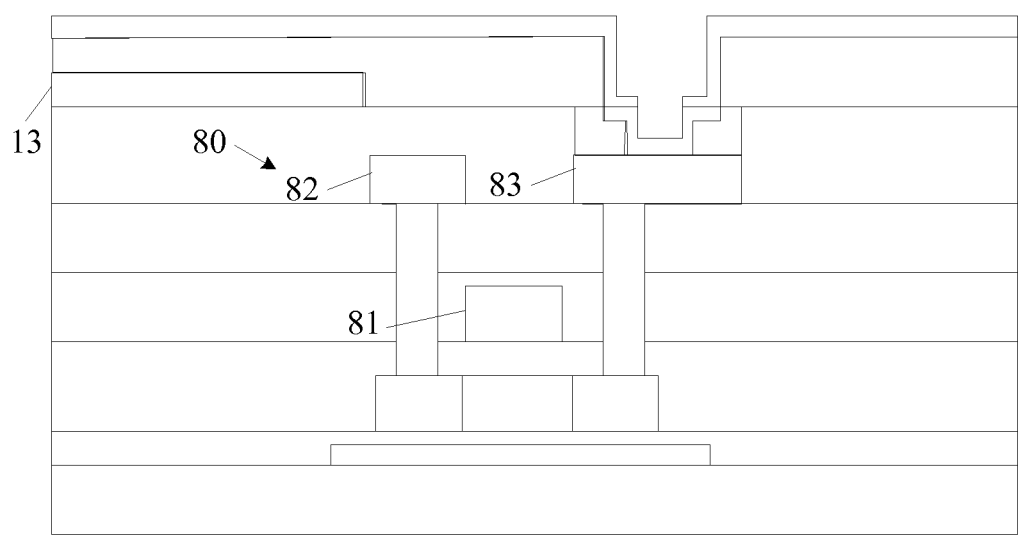
FIG. 8 is a structure diagram of a place where a TFT substrate corresponds to transistor in the present invention.

Additionally, the common electrode 13 of the embodiment of the present invention is also etched on the place of corresponding to the transistor of the TFT substrate. Specifically, refer to FIG. 8, FIG. 8 is a structure diagram of a place where a TFT substrate corresponds to transistor in the present invention. As shown in FIG. 8, the common electrode 13 is etched on the place of corresponding to the gate 81, the source 82 and the drain 83 of the transistor 80, in order to reduce the capacitance between the gate 81 and the common electrode 13, the source 82 and the common electrode 13 as well as the drain 83 and the common electrode 13. Furthermore, it reduces the RC constant and power consumption of the TFT substrate and improves the screen quality.

Because the common electrode 13 is etched, the common electrode material is saved, thereby achieving the purpose of cost down.

Figure 9:
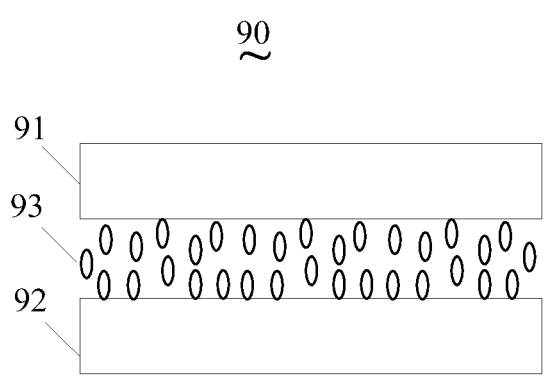
FIG. 9 is a structure diagram of a display device provided by the embodiment of the present invention.

Refer to FIG. 9, the present invention also provides a display device 90, the display device 90 comprises a color film substrate 91, a TFT substrate 92 and a liquid crystal layer 93 disposed between the color film substrate 91 and the TFT substrate 92. Wherein the TFT substrate 92 is the TFT substrate 10 as described above.

The preferred embodiments according to the present invention are mentioned above, which cannot be used to define the scope of the right of the present invention. Those variations of equivalent structure or equivalent process according to the present specification and the drawings or directly or indirectly applied in other areas of technology are considered encompassed in the scope of protection defined by the claims of the present invention.

What is claimed is:

1. A TFT substrate, wherein the TFT substrate comprises a plurality of mutually parallel scan lines, a plurality of mutually parallel data lines and a common electrode covering on the scan lines and data lines, wherein:

the multiple data lines and the multiple scan lines are disposed in a stagger to form a plurality of regions, each region being a pixel unit;

the common electrode comprises a plurality of common electrode units and a plurality of bridging portions overlapping with the scan lines and the data lines, wherein the common electrode unit and the pixel unit are correspondingly disposed, each bridging portion is connected with at least two adjacent common electrodes in order to make all of the common electrodes be electrically connected;

wherein the bridging portion is a conductive film, which is plated on the position corresponded to the scan lines and the data lines.

2. The TFT substrate as claimed in claim 1, wherein each bridging portion is connected with two adjacent common electrodes arranged along with the first direction or is connected with two adjacent common electrodes arranged along with the second direction which is perpendicular to the first direction.

3. A TFT substrate, wherein the TFT substrate comprises a plurality of mutually parallel scan lines, a plurality of mutually parallel data lines and a common electrode covering on the scan lines and data lines, wherein:

the common electrode comprises a plurality of common electrode units and a plurality of bridging portions overlapping with the scan lines and the data lines, wherein the common electrode unit and the pixel unit are correspondingly disposed, each bridging portion is connected with at least two adjacent common electrodes in order to make all of the common electrodes be electrically connected.

4. The TFT substrate as claimed in claim 3, wherein each bridging portion is connected with four adjacently disposed common electrodes.

5. The TFT substrate as claimed in claim 3, wherein each bridging portion is connected with two adjacent common electrodes arranged along with the first direction or is connected with two adjacent common electrodes arranged along with the second direction which is perpendicular to the first direction.

6. The TFT substrate as claimed in claim 5, wherein each common electrode unit is connected with all adjacent common electrode units which are arranged along with the first direction and the second direction which is perpendicular to the first direction through the bridging portion, in order to make all common electrode units establish a latticed connection.

7. The TFT substrate as claimed in claim 5, wherein each common electrode unit is connected with part of adjacent common electrode units which are arranged along with the first direction and the second direction through the bridging portion, in order to make all common electrode units establish a linear connection.

8. The TFT substrate as claimed in claim 7, wherein the bridging portion comprises a first bridging portion and a second bridging portion, in each two common electrode units arranged along with the first direction or the second direction, each two common electrode units which are corresponded at adjacent lines are individually connected through the first bridging portion, each two common electrode units which are on the same side are connected at intervals through the second bridging portion.

9. The TFT substrate as claimed in claim 7, wherein the bridging portion comprises a first bridging portion and a second bridging portion, between a line of each common electrode unit arranged along with the first direction or the second direction is connected through the first bridging portion, and the place on the edge of the line of common electrode unit is connected with the common electrode unit which is on the corresponded place at the adjacent line through the second bridging portion.

10. The TFT substrate as claimed in claim 3, wherein the bridging portion is directly obtained from the etching process of the common electrode.

11. The TFT substrate as claimed in claim 3, wherein the bridging portion is a conductive film that is plated on the formed multiple common electrode units.

* * * * *